United States Patent
Naeini et al.

(10) Patent No.: US 8,847,685 B2
(45) Date of Patent: Sep. 30, 2014

(54) PUSH-PULL AMPLIFIER AND DIFFERENTIAL PUSH-PULL AMPLIFIER

(75) Inventors: Ashkan Naeini, Munich (DE); Martin Simon, Otterfing (DE); Herbert Stockinger, Schliersee (DE); Werner Schelmbauer, Steyr (AT); Bernd-Ulrich Klepser, Starnberg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 60 days.

(21) Appl. No.: 13/617,396

(22) Filed: Sep. 14, 2012

(65) Prior Publication Data

US 2014/0077879 A1 Mar. 20, 2014

(51) Int. Cl.
*H03F 3/26* (2006.01)
*H03F 1/22* (2006.01)
*H03F 3/30* (2006.01)

(52) U.S. Cl.
CPC ............... *H03F 3/301* (2013.01); *H03F 1/223* (2013.01)

USPC .......................................... 330/264; 330/311

(58) Field of Classification Search
CPC ..... H03F 3/301; H03F 3/3061; H03F 3/3064; H03F 3/3066; H03F 3/3081; H03F 3/22; H03F 3/223; H03F 1/22; H03F 1/223
USPC .......................... 330/255, 263, 264, 269, 311
See application file for complete search history.

(56) References Cited

U.S. PATENT DOCUMENTS

| | | | |
|---|---|---|---|
| 5,373,249 A * | 12/1994 | Barrett et al. | 330/264 |
| 5,742,205 A * | 4/1998 | Cowen et al. | 330/269 |
| 5,781,072 A | 7/1998 | Kaltenecker | |
| 5,963,094 A | 10/1999 | Linder et al. | |
| 6,107,885 A * | 8/2000 | Miguelez et al. | 330/276 |
| 6,373,337 B1 | 4/2002 | Ganser | |
| 6,542,037 B2 * | 4/2003 | Noll et al. | 330/301 |

* cited by examiner

*Primary Examiner* — Steven J Mottola
(74) *Attorney, Agent, or Firm* — Eschweiler & Associates, LLC

(57) ABSTRACT

A push-pull amplifier includes an amplifier input, a push amplifier stage, a pull amplifier stage and an inverting amplifier output.

28 Claims, 5 Drawing Sheets

PUSH-PULL AMPLIFIER AND DIFFERENTIAL PUSH-PULL AMPLIFIER

FIELD

Embodiments of the present invention refer to a push-pull amplifier, to a differential push-pull amplifier, to a transceiver circuit comprising a differential push-pull amplifier and to a mobile communication device having a transceiver circuit.

BACKGROUND

Most of modern communication devices or communication systems with high throughput rely on a multiple inputs-outputs concept to support a wider transmission bandwidth. For example, the 4G LTE advance standard specifies a Carrier Aggregation solution (CA) to expand its effective bandwidth beyond 20 MHz. The carrier aggregation concept proposes to aggregate multiple component carriers to form a larger overall transmission bandwidth. In case of intra-band area aggregation the component carriers fall into the same band with one physical input port. Therefore, there is the need for an efficient separation of component carriers.

SUMMARY

Embodiments of the invention provide a push-pull amplifier comprising an amplifier input, a push amplifier stage, a pull amplifier stage and an inverting amplifier output. The push amplifier stage comprises a first adjustable RC impedance matching circuit and two transistors of a first transistor type arranged in series such that an output contact of the first transistor of the first transistor type and an input contact of the second transistor of the first transistor type are coupled to each other via a first common node. The pull amplifier stage comprises a second adjustable RC impedance matching circuit and two transistors of a second transistor type arranged in series such that an output contact of the first transistor of the second transistor type and an input contact of the second transistor of the second transistor type are coupled to each other via a second common node. The respective first transistors of the push amplifier stage and of the pull amplifier stage have control contacts thereof coupled to the amplifier input, wherein the respective adjustable RC impedance matching circuits have a first side thereof coupled to the amplifier input and a second side thereof coupled to the respective common nodes of the push amplifier stage and of the pull amplifier stage, and wherein the second transistors of push amplifier stage and the second transistor of the pull amplifier stage have output contacts thereof output to each other and to the inverting amplifier output.

A further embodiment provides a differential push-pull amplifier which comprises a differential input, a differential output, a first push-pull amplifier and a second push-pull amplifier. The differential input has a p-input and an n-input, wherein the differential output has an n-output and a p-output. The first push-pull amplifier is arranged between the p-input and the n-output and the second push-pull amplifier is arranged between the n-input and the p-output. Each push-pull amplifier comprises an amplifier input connected to the p-input or to the n-input, a push amplifier stage, a pull amplifier stage and an inverting amplifier output connected to the n-output or to the p-output. The push amplifier stage comprises a first adjustable RC impedance matching circuit and two transistors of a first transistor type arranged in series such that an output contact of the first transistor of the first transistor type and an input contact of the second transistor of the second transistor type are coupled to each other via a first common node. The pull amplifier stage comprises a second adjustable RC impedance matching circuit and two transistors of a second transistor type arranged in series such that an output contact of the first transistor of the second transistor type and an input contact of the second transistor of the second transistor type are coupled to each other via a second common node. The respective first transistors of the push amplifier stage and of the pull amplifier stage have control contacts thereof coupled to the amplifier input, wherein the respective adjustable RC impedance matching circuits have a first side thereof coupled to the amplifier input and a second side thereof coupled to the respective common nodes of the push amplifier stage and of the pull amplifier stage, and wherein the second transistor of the push amplifier stage and the second transistor of the pull amplifier stage have an output contact thereof coupled to each other and to the inverting amplifier output.

A further embodiment provides a differential pull amplifier which comprises a differential input, a differential output, a first push-pull amplifier and a second push-pull amplifier. The differential input has a p-input and an n-input, wherein the differential output has an n-output comprising a first capacitor and a p-output comprising a second capacitor. The first push-pull amplifier is arranged between the p-input and the n-output and the second push-pull amplifier is arranged between the n-input and the p-output. Each push-pull amplifier comprises an amplifier input, connected to the p-input or to the n-input, a push amplifier stage, a pull amplifier stage and an inverting output connected to the n-output or to the p-output. The push amplifier stage comprises a first RC impedance matching circuit, comprising a first adjustable resistor and a first capacitor connected in series, and two MOSFET transistors of a PMOS type arranged in series such that an output contact of the first MOSFET transistor of the PMOS type and an input contact of the second MOSFET transistor of the PMOS type are coupled to each other via a first common node. The pull amplifier stage comprises a second RC impedance matching circuit, comprising a second adjustable resistor and a second capacitor connected in series, and two MOSFET transistors of an NMOS type arranged in series such that an output contact of the first MOSFET transistor of the NMOS type and an input contact of the second MOSFET transistor of the NMOS type are coupled to each other via a second common node. The respective first MOSFET transistors of the push amplifier stage and of the pull amplifier stage have control contact thereof coupled to the amplifier input, wherein the respective adjustable RC impedance matching circuits have a first side thereof coupled to the amplifier input and a second side thereof coupled to the respective common nodes of the push amplifier stage and of the pull amplifier stage, and wherein the second MOSFET transistor of the push amplifier stage and the second MOSFET transistor of the pull amplifier stage have an output contact thereof coupled to each other and to the inverting amplifier output. The push amplifier stages of the first and the second push-pull amplifier comprise one or more gain adjusting MOSFET transistors of the PMOS type arranged in parallel to the respective second MOSFET transistors of the PMOS type such that the one or more gain adjusting MOSFET transistors are connected between these respective first common nodes and the respective inverting amplifier outputs, wherein the pull amplifier stages of the first and the second push-pull amplifiers comprises one or more gain adjusting MOSFET transistors of the NMOS type arranged parallel to the respective second MOSFET transistors of the NMOS type such that the one or more gain adjusting MOSFET transistors are connected between the respective second common nodes and the respective amplifier outputs. Each of the one or more gain adjusting MOSFET transistors of the push amplifier stage comprises a differential gain canceling MOSFET transistor of the PMOS type which is connected between the respective first common nodes and a respective non-inverting amplifier output, wherein each of the one or more gain adjusting MOSFET transistors of the pull amplifier stages comprise a differential gain canceling MOSFET transistor of the NMOS type which is connected between the respective second common nodes and the respective non-inverting amplifier outputs. The non-inverting amplifier outputs of the first push-pull amplifier is connected to the inverting amplifier output of the second push-pull amplifier and wherein the non-inverting amplifier outputs of the second push-pull amplifier is connected to the inverting amplifier output of the first push-pull amplifier.

A further embodiment provides a transceiver circuit which comprises a first differential push-pull amplifier. The first differential push-pull amplifier comprises a differential input, a differential output, a first push-pull amplifier, and a second push-pull amplifier. The differential input has a p-input and an n-input, wherein the differential output has an n-output and a p-output and is coupled to a first mixer configured to output a quadrature component (Q) of an input signal and to a second mixer configured to output an in-phase component (I) of an input signal. The first push-pull amplifier is arranged between the p-input and the n-output, and the second push-pull amplifier is arranged between the n-input and the p-output. Each push-pull amplifier comprises an amplifier input connected to the p-input or to the n-output, a push amplifier stage and a pull amplifier stage. The push amplifier stage comprises a first adjustable RC impedance matching circuit, two transistors of a first transistor type, which are arranged in series such that an output contact of the first transistor of the first transistor type and an input contact of the second transistor of the first transistor type are coupled to each other via a first common node, and one or more gain adjusting transistors of the first transistor type, which are arranged in parallel to the second transistor of the first transistor type such that the one or more gain adjusted transistor of the first transistor type are connected between the first common node and the inverting amplifier output. Each of the one or more gain adjusting transistors of a first transistor type comprises a differential gain canceling transistor of the first transistor type which is connected between the first common node and a non-inverting amplifier output. The pull amplifier stage comprises a second adjustable RC impedance matching circuit, two transistors of a second transistor type, which are arranged in series such that an output contact of the first transistor of the second transistor type and an input contact of the second transistor of the second transistor type are coupled to each other via a second common node, and one or more gain adjusting transistors of the second transistor type, which are arranged in parallel to the second transistor of the second transistor type such that the one or more gain adjusting transistors of the second transistor type are connected between the second common node and the inverting amplifier output. Each of the one or more gain adjusting transistors of the second transistor type comprises a differential gain canceling transistor of the second transistor type which is connected between the second common node and the non-inverting amplifier output. The inverting amplifier output is connected to the n-output or to the p-output. The respective first transistors of the push amplifier stage and of the pull amplifier stage have control contacts thereof coupled to the amplifier input, wherein the respective adjustable RC impedance matching circuits have a first side thereof coupled to the amplifier input and a second side thereof also coupled to the respective common nodes of the push amplifier stage and of the pull amplifier stage, and wherein the second transistors of the push amplifier stage and the second transistor of the pull amplifier stage have an output contact thereof coupled to each other and to the inverting amplifier output. The non-inverting amplifier output of the first push-pull amplifier is connected to the inverting output of the second push-pull amplifier and wherein the non-inverting amplifier output of the second push-pull amplifier is connected to the inverting amplifier output of the first push-pull amplifier.

A further embodiment provides a mobile communication device which comprises a transceiver circuit comprising at least one differential push-pull amplifier. The differential push-pull amplifier comprises a different differential input, a differential output, a first push-pull amplifier and a second push-pull amplifier. The differential input has a p-input and an n-input and, wherein the differential output has an n-output and a p-output and is coupled to a first mixer configured to output a quadrature component of an input signal and to a second mixer configured to output an in-phase component of an input signal. The first push-pull amplifier is arranged between the p-input and the n-output and the second push-pull amplifier is arranged between the n-input and the p-output. Each push-pull amplifier comprises an amplifier input connected to the p-input or to the n-input, a push amplifier stage and a pull amplifier stage. The push amplifier stage comprises a first adjustable RC impedance matching circuit, two transistors of a first transistor type, which are arranged in series such that an output contact of the first transistor of a first transistor type and an input contact of the second transistor of the first transistor type are coupled to each other via a first common node, and one or more gain adjusting transistors of the first transistor type, which are arranged in parallel to the second transistor of the first transistor type such that the one or more gain adjusting transistors of the first transistor type are connected between the first common node and an inverting amplifier output. Each of the one or more gain adjusting transistors of the first transistor type comprises a differential gain canceling transistor of the first transistor type, which is connected between the first common node and a non-inverting amplifier output. The pull amplifier stage comprises a second adjustable RC impedance matching circuit and two transistors of a second transistor type, which are arranged in series such that an output contact of the first transistor of the second transistor type and an input contact of the second transistor of the second transistor type are coupled to each other via a second common node, and one or more gain adjusting transistors of the second transistor type, which are arranged in parallel to the second transistor of the second transistor type such that the one or more gain adjusting transistors of the second transistor type are connected between the second common node and the inverting amplifier output. Each of the one or more gain adjusting transistors of the second transistor type comprises a differential gain canceling transistor of the second transistor type which is connected between the second common node and the non-inverting amplifier output. The respective first transistors of the push amplifier stages and of the pull amplifier stages have control contact thereof coupled to the amplifier input, wherein the respective adjustable RC impedance matching circuits have a first side thereof coupled to the amplifier input and a second side thereof coupled to the respective common nodes of the push amplifier stages and of the pull amplifier stages, and wherein the second transistor of the push amplifier stages and the second transistor of the pull amplifier stages have output contacts thereof coupled to each other and to the respective inverting amplifier output of the first and second push-pull amplifiers. The inverting amplifier output is connected to the n-output or to the p-output. The non-inverting amplifier output of the first push-pull amplifier is connected to the inverting amplifier output of the second push-pull amplifier and wherein the non-inverting amplifier output of the second push-pull amplifier is connected to the inverting amplifier output of the first push-pull amplifier.

BRIEF DESCRIPTION OF THE DRAWINGS

Embodiments of the present invention are described in the following with respect to the figures.

DETAILED DESCRIPTION

Figure 1:
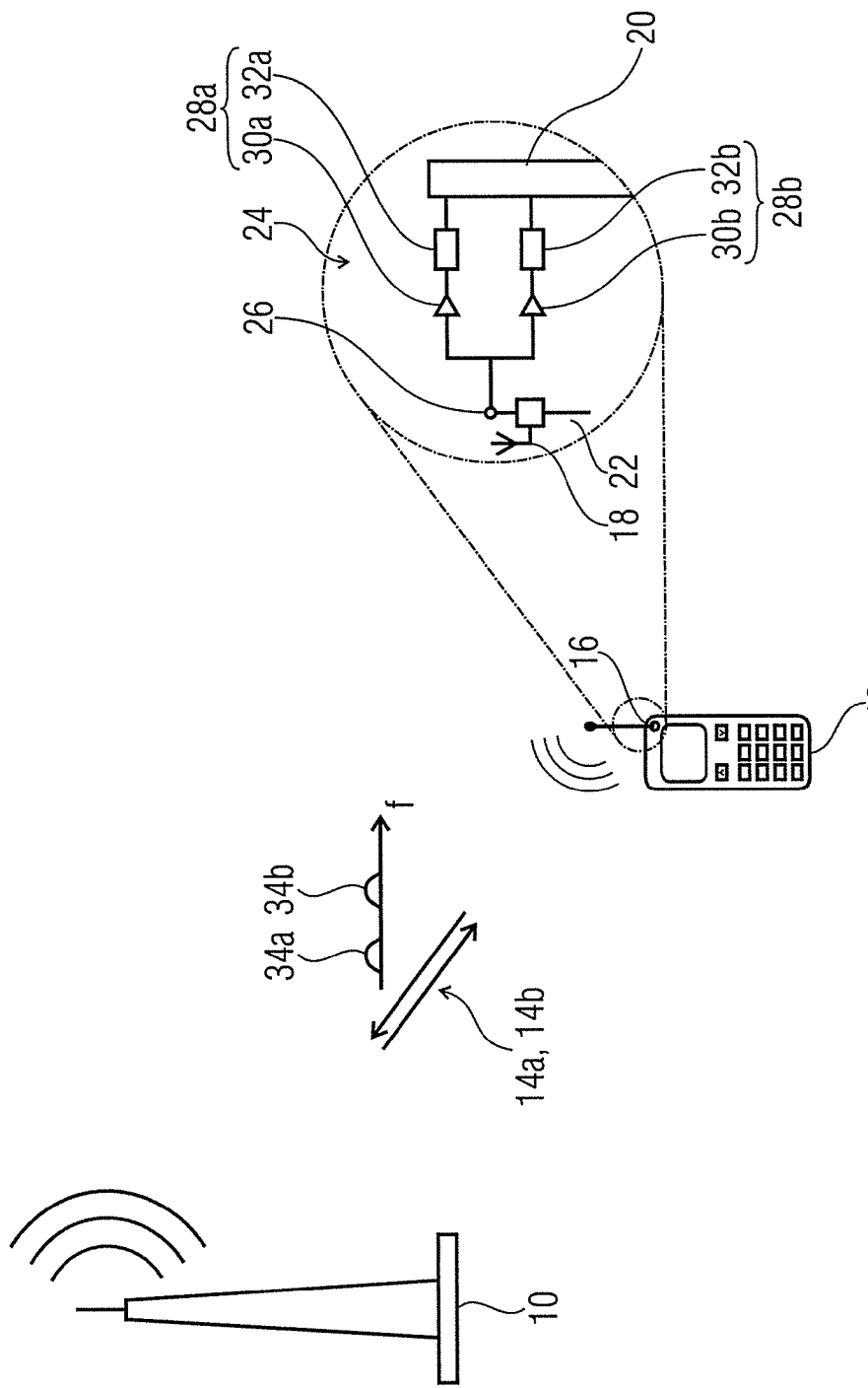
FIG. 1 shows a block diagram of a communication system and a mobile communication device having a transceiver with an improved push-pull amplifier.

Different embodiments of the teachings disclosed herein will subsequently be discussed referring to FIG. 1 and to FIG. 4. Bellow, identical reference numerals are provided to objects having identical or similar functions so that objects referred to by identical reference numerals within the different embodiments are interchangeable and a description thereof is mutually applicable.

FIG. 1 shows a base station 10 and a mobile communication device 12 which are connected via a downlink port 14a and an uplink port 14b of an air interface. The mobile communication device 12 comprises a transceiver 16, an enlarged view of which is shown.

The transceiver 16 is connected to the antenna 18 and comprises an analog frontend and a baseband processor 20. The analog frontend comprises a signal divider element 22, e.g. a circulator, a receiver 24 and a transmitter (not shown). The receiver 24 is arranged between the signal divider element 22 and the baseband processor 20, and comprises, in one embodiment, a plurality of parallel signal paths 28a and 28b, wherein each signal path 28a and 28b is connected to the divider element 22 via a differential input 26 of the receiver 24. Each signal path 28a and 28b comprises a respective differential amplifier 30a and 30b and a respective mixer arrangement 32a and 32b which are arranged between the amplifiers 30a and 30b and the baseband processor 20.

As discussed above, carrier aggregation is one solution for increasing the bandwidth of the downlink 14a and the uplink 14b between the base station 10 and the mobile communication device 12. So, multiple component carriers 34a and 34b are aggregated to form a large overhaul transmission bandwidth for the downlink port 14a or the uplink 14b. The following discussion refers to the downlink 14a, but is transferable to the uplink 14b, too. The two carriers 34a and 34b used for the downlink 14b are received by the receiver 24. In more detail, the first and the second carrier 34a and 34b are received via the one antenna 18, the signal divider element 22, which distributes the inbounding and outbounding signals to the receiver 24 and the transmitter (not shown), and the receiver 24. In case of carrier aggregation, the first carrier 34a is received and processed via the first signal path 28a, wherein the second carrier 34b is received and processed via the second signal path 28b. Because the two component carriers 34a and 34b fall into the same band with one physical input port (differential input 26) the component carriers 34a and 34b are separated so that same may be processed in the two separated input paths 28a and 28b. Below, state-of-the-art solutions for a separation of the component carriers 34a and 34b will be discussed before an improved approach of which will be discussed.

A state-of-the-art solution applied to Wifi and Edge-Evo is to shift a carrier separation outside the transceiver chip by using multiple antennas. A further state-of-the-art solution is to integrate a power splitter connected to one antenna into the differential input 26, wherein the power splitter performs the separation or, in more detail, the impedance matching. Such an off-chip power splitter may cause additional losses, larger board area, higher BOM cost and larger chip size. Therefore, there is a need for an improved approach according to which the separation of the component carriers 34a and 34b is accomplished inside the receiver chip and the receiver 24, respectively.

The separation of the component carriers 34a and 34b in the receiver 28 is reached by the use of a new amplifier type for the differential amplifiers 30a and 30b. Due to the improved differential amplifiers 30a and 30b the signal paths 28a and 28b may be directly connected to the antenna 18 via the differential input 26 without the power splitter and the signal divider element 28. Therefore, each push-pull amplifier 30a and 30b comprises means for impedance matching. Thus, the differential amplifiers 30a and 30b, also referred to as low noise amplifiers (LNA circuit), which have a push-pull configuration may further extend to the carrier aggregation architecture with a single input and multiple outputs. Such architecture leads to a small chip size and, thus, a small board area (BOM). Furthermore, this carrier aggregation architecture possesses low noise and low losses.

Figure 2:
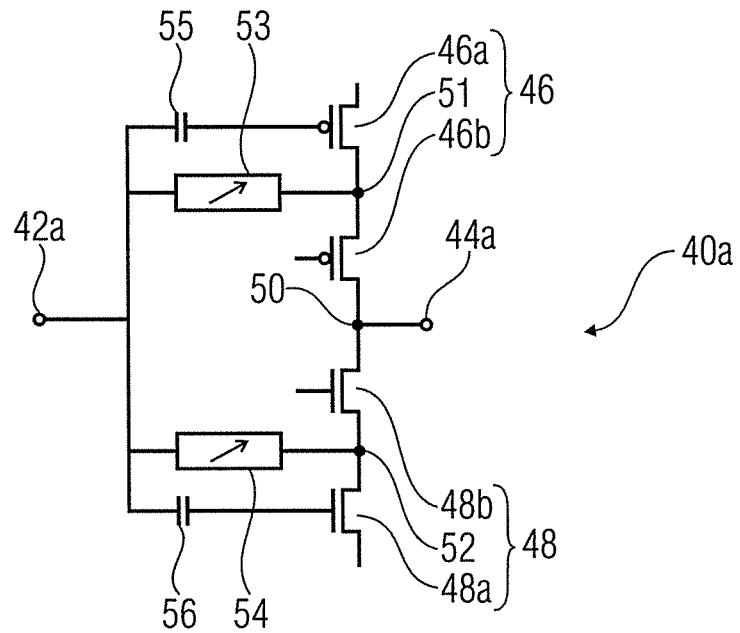
FIG. 2 shows a block diagram of an exemplary implementation of a differential push-pull amplifier comprising improved push-pull amplifiers having adjustable impedance matching circuits.
Figure 2:
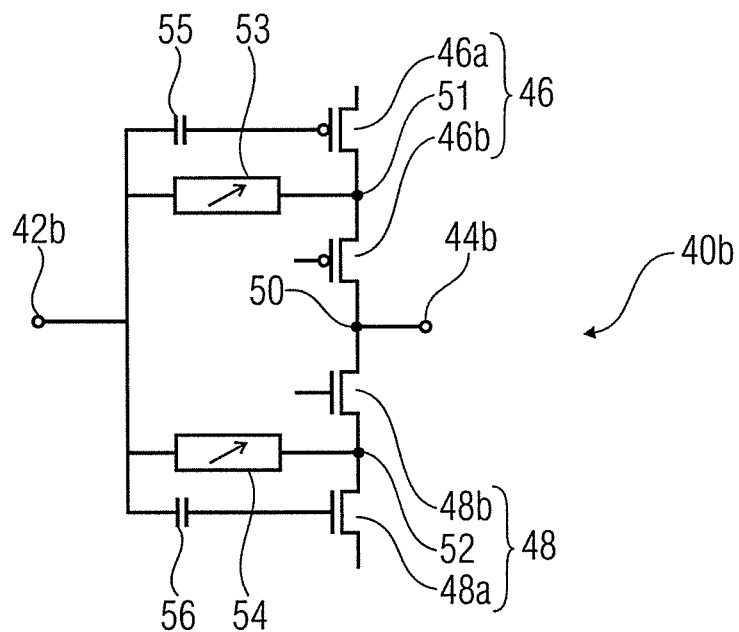

Referring to FIG. 2, the push-pull amplifier 30a and 30b will be discussed in more detail. FIG. 2 shows a simple implementation of two push-pull amplifiers 40a and 40b which together form a differential amplifier 40 and may be applied to the transceiver 16 (cf. amplifier 30a, 30b) according to FIG. 1.

The differential push-pull amplifier 40 comprises a first push-pull amplifier 40a and a second push-pull amplifier 40b. Each push-pull amplifier 40a and 40b forms a single-ended push-pull amplifier. The first single-ended push-pull amplifier 40a, which acts as an inverter, is arranged between a p-input 42a and an n-output 44a, wherein the second single-ended push-pull amplifier 40b, which also acts as an inverter, is arranged between an n-input 42b and a p-output 44b. I.e. that the p-input 42a and the n-input 42b forms a differential input 42 (=42a+42b) of the differential push-pull amplifier 40 and that the n-output 44a(also referred to as inverting amplifier output 44a) and the p-output 44b (also referred to as inverting amplifier output 44b) forms a differential output 44 (=44a+44b) of the differential push-pull amplifier 40. Below, the push-pull amplifier 40a will be discussed which is representative for the push-pull amplifier 40b. Consequently, the elements of the second push-pull amplifier 40b are marked with the same reference numerals as discussed in the context of the push-pull amplifier 40a due to the nearly identical structure of the two push-pull amplifiers 40a and 40b of the differential amplifier 40.

The push-pull amplifier 40a comprises a push amplifier stage 46 and a pull amplifier stage 48. The pull amplifier stage comprises two transistors 46a and 46b, e.g. FET or MOSFET transistors, connected in series such that an output contact (e.g. a drain contact) of the first transistor 46a is connected to an input contact (e.g. a source contact) of the second transistor 46b via a first common node 51. Analogously, the pull amplifier stage 48 comprises two (FET or MOSFET) transistors 48a and 48b connected in series such that an output contact (e.g. drain contact) of the first transistor 48a is connected to an input contact (e.g. source contact) of the second transistor 48b via a second common node 52. The two amplifier stages 46 and 48 are coupled to each other via a respective output contact of the respective second transistor 46b and 48b (e.g. via its respective drain contact) at a center tap 50. The push amplifier stage 46 differs from the pull amplifier stage 48 regarding its transistor type. So, the push amplifier stage 46 may comprise transistors of a first transistor type, e.g. of PMOS transistors, while the pull amplifier stage 48 may comprise transistors of a second transistor type complementary to the first transistor type, e.g. NMOS transistors. These coupled output contacts form the n-output 44a, wherein the p-input 42a is connected to respective control contacts, e.g. gate contacts, of the respective first transistor 46a and 48a of the push and the pull amplifier stage 46 and 48. Furthermore, the push amplifier stage 46 comprises a first adjustable RC impedance matching circuit 53, wherein the pull amplifier stage 48 comprises a second adjustable RC impedance matching circuit 54. The two adjustable RC impedance matching circuits 53 and 54 are arranged between the p-input 42a and the respective common node 51 and 52.

The shown push-pull amplifier 40a is configured to receive an amplifier signal applied to the p-input 42a and to output the amplified signal via the n-output 44a when a power supply (not shown) is connected to the push-pull amplifier 40a. For example, ground may be connected to the input contact of the first transistor 48a while power supply is connected to the input contact of the first transistor 46a. So, the push amplifier stages 46 supplies or sources current to the load from a positive power supply, wherein the pull amplifier stage 48 dissipates or sinks current from the load to ground (or a negative power supply). I.e. that the two amplifier stages 46 and 48 operate in anti-phase, i.e. 180° apart. This leads to less distortion (compared to a single amplifier) because non-linearities in the two amplifier stages 46 and 48 are subtracted from each other due to the symmetric arrangement. Here, each amplifier stage 46 and 48 is formed by a two-stage transistor arrangement, also referred to as cascode (comprising the transistor 46a and 46b or comprising the transistor 48a and 48b). Expressed in other words, the push-pull amplifier 40a is built up of two single stage pseudo differential transconductors comprising two pairs of complementary transistors 46a and 48a as well as 46b and 48b, which are connected like a CMOS inverter. Due to the cascode arrangement (cascode 46a+46b and cascode 48a+48b, respectively) the performance of each amplifier stage 46 and 48 is improved and has a high current stability. The background thereon is that the first transistor 46a (48a) has a nearly constant voltage at its input contact and its output contact. This avoids nearly any feedback into the control contact of same 46a (48a). Furthermore, the second transistor 46b (48b) has a nearly constant voltage at its input contact and its control contact, so the only contacts with significant voltage on them are the control contacts (cf. p-input 42a) of the first transistor 46a (48a) and the output contact (cf. n-output 44a) of the second transistor 46b (48b). Furthermore, due to this arrangement the p-input 42a is effectively isolated from the n-output 44a by the respective second transistor 46b and 48b. A further advantage of the cascode arrangement 46a+46b and 48a+48b, respectively, is the high input impedance.

The input impedance may be adjusted via the two adjustable RC impedance circuits 53 and 54. Due to the arrangement of the adjustable RC impedance matching circuit 53 and 54 between the respective first and second common node 51 and 52 and the p-input 42a the RC impedance matching circuits form two separate feedback loops. So, the input impedance may be reduced by feeding back an output signal from the output 44a to the input 42a. In order to adjust this feedback, each impedance matching circuit 53 and 54 is adjustable via an adjustable resistor or via an adjustable capacitor. Due to the adjustable RC impedance matching circuit 53 and 54 the push-pull amplifier 40a may be implemented as a coil-less low noise amplifier having a reduced board area when compared to an amplifier comprising coils which usually possesses a large space requirement.

According to further implementations, a respective capacitor 55 and 56 may be arranged between the input 42a and the control contact (e.g. a gate contact) of the respective first transistor 46a and 48a. Due to these capacitors 35 and 55 that input 42a is AC coupled to enable a common mode regulation in the pseudo differential push-pull mode.

Figure 3:
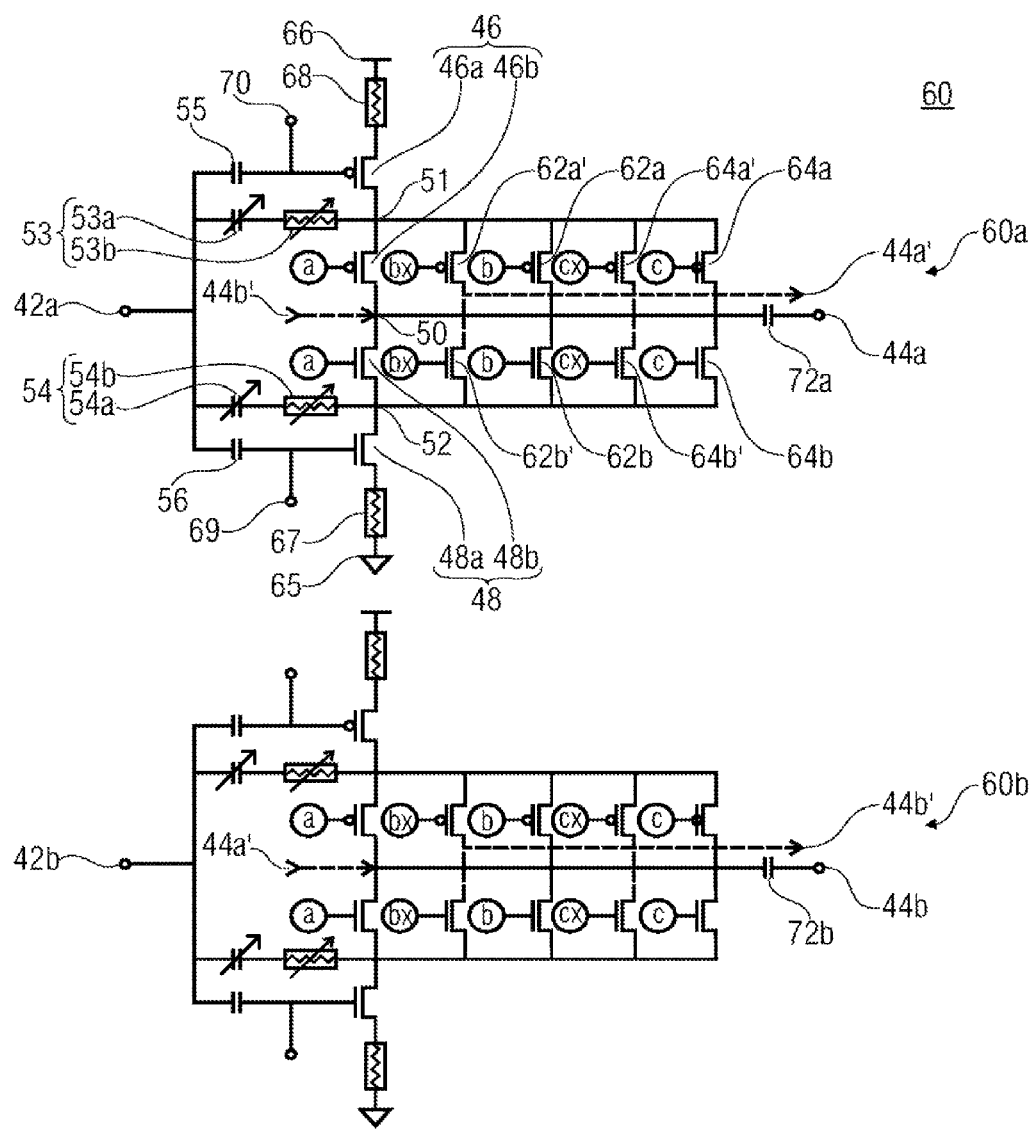
FIG. 3 shows a block diagram of an exemplary implementation of a differential push-pull amplifier comprising improved push-pull amplifiers having means for gain adjusting or gain cancelling.

FIG. 3 shows a further implementation of a differential push-pull amplifier 60. The differential push-pull amplifier 60 comprises a first push-pull amplifier 60a and a second push-pull amplifier 60b which are substantially equal to the push-pull amplifiers 40a and 40b of FIG. 2. According to the description of FIG. 2 the push-pull amplifier 60a will be described respective for the push-pull amplifier 60b.

In this different implementation, each amplification stage 46 and 48 of the push-pull amplifiers 60a and 60b comprises a plurality of gain adjusting transistors. The gain adjusting transistors 62a and 64a of the push amplifier stage 46 are connected in parallel to the second transistor 46b such that the gain adjusting transistors 62a and 64a are connected between the first common node 51 and the center tap 50 (and, thus, to the n-output 44a). The gain adjusting transistors 62a and 64a are also of the first transistor type. The pull amplifier stage 48 also comprises two gain adjusting transistors 62b and 64b of the second transistor type which are arranged in parallel to the second transistor 48b (i.e. between the second common node 52 and the center tap 50). These gain adjusting transistors 62a, 64a, 62b and 64b are arranged with its respective input contact to the respective common nodes 51 and 52 and with its respective output contacts to the center tap 50, wherein same are selectively switchable via its control contracts by using a control signal "b" and/or "c" (marked with b and c) so that a gradual gain adjustment may be achieved. Due to these gain adjusting transistors 62a, 64a, 62b and 64b, gain steps are implemented by partitioning of current flowing through the push amplifier stage 46 and the pull amplifier stage 48 with respective proportion depending on the respective enabled transistors 46b (control signal "a"), 62a (control signal "b") and 64a (control signal "c") or 48b (control signal "a"), 62b (control signal "b") and 64b (control signal "c").

In one example, each of these gain adjusting transistors 62a, 64a, 62b and 64b is combined with a differential gain canceling transistor 62a', 64a', 62b' and 64b' which are arranged between the respective common nodes 51 and 52 and a non-inverting amplifier output 44a'. It should be noted that the differential gain canceling transistors 62a' and 64a' are of the first transistor type, wherein the gain canceling transistors 62b' and 64b' are of the second transistor type. The differential gain canceling transistors 62a', 64a', 62b' and 64b' form a counterpart to the gain adjusting transistors 62a, 64a, 62b and 64b such that the differential gain canceling transistors 62a', 64a', 62b' and 64b' are configured to redirect the dedicated amount of amplified current to the complementary output 44b or 44a, respectively. Therefore, the non-inverting output 44a' of the first push-pull amplifier 60a is connected to the inverting output 44b of the second push-pull amplifier 60b, so that the gain may be reduced by coupling the first push-pull amplifier 60a to the output 44b of the second push-pull amplifier 60b when the gain cancelling mode is activated via a control signal applied to the control contact of gain canceling transistors 62a', 64a', 62b' and 64b' (cf. control signals "bx", "cx"). Analogously, the second push-pull amplifier 60b also comprises a non-inverting output 44b' which is connected to the inverting output 44a of the first push-pull amplifier 60a via the center tab 50 so that a gain reduction may be performed. I.e., respective gain steps are formed by a combination of enabling gain adjusting transistors 62a, 64a, 62b and 64b and of enabling differential gain canceling transistors 62a', 64a', 62b' and 64b'. It should be noted that the respective gain steps (cf. 62a and 62b or 64a and 64b) of the push amplifier stage 46 and the pull amplifier stage 48 are typically enabled simultaneously. In contrast, the gain adjusting transistors 62a, 64a, 62b, 64b are typically not enabled at the same time of enabling the corresponding differential gain canceling transistor 62a', 62b', 64a' and 64b'.

In this implementation, the first adjustable RC impedance matching circuit 53 is realized by a capacitor 53a and an adjustable resistor 53b, wherein the second adjustable RC impedance matching circuit 54 is realized by a capacitor 54a and an adjustable resistor 54b. For example, the adjustable resistors 53b and 54b may comprise a programmable resistor network having a plurality of switchable resistors so that the resistivity of same may be adjusted. Alternatively, the adjustable RC matching circuit 53 and 54, respectively, may comprise a programmable capacitance network for adjusting the impedance.

As discussed above, the power supply for each push-pull amplifier 60a and 60b may be applied between the input contacts of the first transistors 46a and 48a. Thus, the input contact of the first transistor 48a of the pull amplifier stage 48 is coupled to a ground terminal 65 via an optional resistor 67, wherein the input contact of the first transistor 46a of the push amplifier stage 46 is coupled to a $V_{dd}$ terminal 66 via an optional resistor 68. This adequate resistive source degeneration formed by the resistors 67 and 68 can be optionally utilized to prove the linearity and compression point of the amplifier 40.

According to another implementation, a respective control terminal 69 and 70 may be directly connected to the (gate) control contact of the respective first transistors 46a and 48a in order to adjust the bias of the two transistors 46a and 48a. Due to the optional capacitors 55 and 56, the respective control terminals 70 and 69 are separated from the input 42a and thus from each other such that each (gate) bias voltage of the push amplifier stage 46 and pull amplifier stage 48 may be adjusted separately.

According to another implementation, the outputs 44a and 44b, respectively, comprise the capacitor 72a and 72b, respectively, in order to provide AC-coupled outputs preventing any DC current flowing through the differential output 44.

Two applications of the above-discussed differential amplifiers 40 and 60 will be discussed below, with a particular focus on the advantages of the above-discussed differential amplifiers.

Figure 4A:
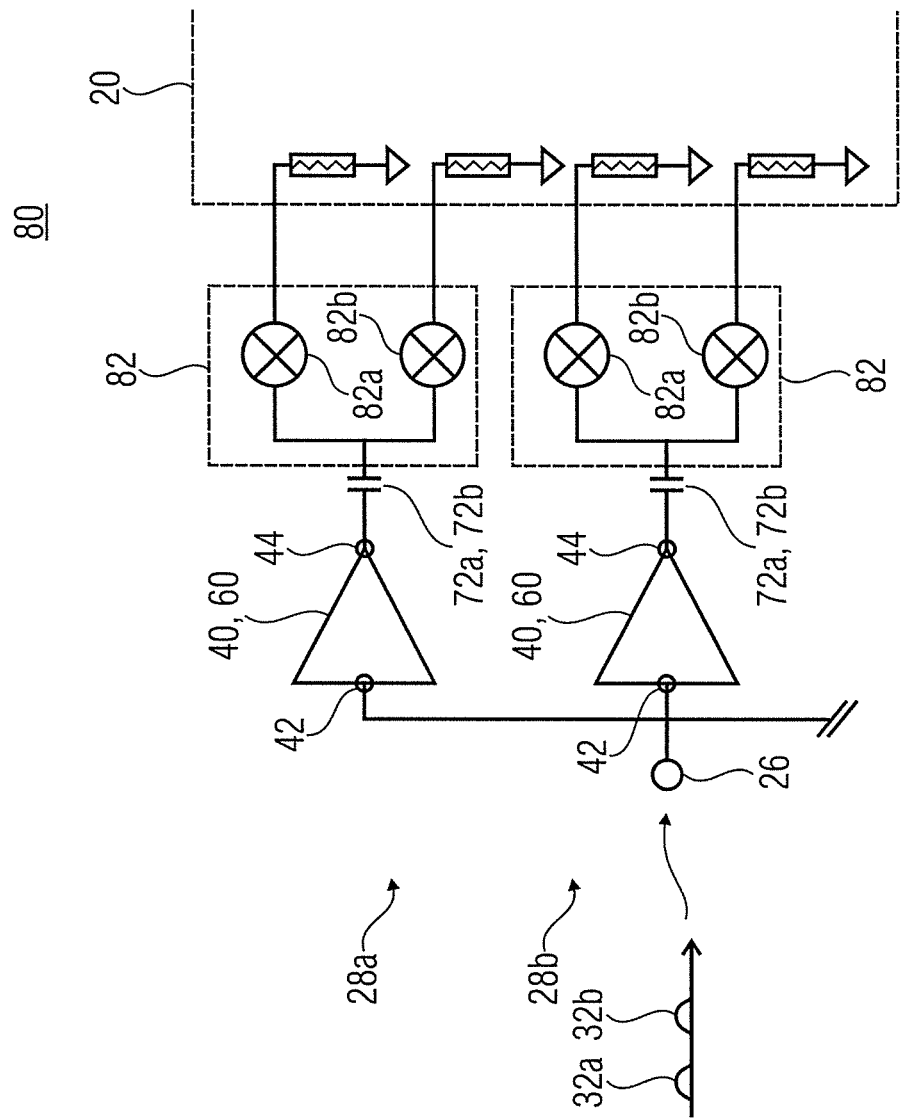
FIGS. 4a and 4b show block diagrams of an exemplary implementation of transceivers having improved differential push-pull amplifiers.

FIG. 4a shows a receiver 80 having at least two signal paths 28a and 28b. Each signal path 28a and 28b comprises an improved amplifier 40 or 60 (OTA) and a mixer arrangement 82 which is AC-coupled to the respective differential amplifier 40 or 60 via a capacitor 72a for the (inverting) n-output 44a and a capacitor 72b for the (inverting) p-output 44b. The mixer arrangement 82, also referred to as IQ demodulator, of the first signal path 28a comprises a first mixer 82, e.g. a 25% duty-cycle mixer, which is configured to output an in-phase component (real part) of the received signal 32a to the baseband processor 20, and a second mixer 82b, e.g. a 25% duty-cycle mixer which is configured to output a quadrature component (imaginary part) of the received signal 32a to the baseband processor 20. Vice versa, the mixer arrangement 82 of the second signal path 28b is substantially equal to the above mixer arrangement 82. So, the mixer arrangement 82 of the second signal path 28b also comprises the first mixer 82 configured to output an in-phase component of the further received signal 32b to the baseband processor 20, and a second mixer 82b configured to output a quadrature component of the further received signal 32b to the baseband processor 20.

Due to the improved differential push-pull amplifiers 40, 60 having the adjustable RC impedance matching circuits (not shown) the differential input 26 of the receiver 80 may be directly connected to the amplifiers 40, 60 (and the differential inputs 42 of the amplifiers 40, 60, respectively) of the two or more signal paths 28a and 28b, wherein each signal path 28a and 28b may be used for processing a selected carrier 32a or 32b of the plurality of received carriers 32a and 32b. I.e. the amplifiers 40, 60 of the plurality of signal paths 28a and 28b are directly connected to the differential input 26 and to the one physical input path 26, respectively. Thereby every component carrier path 28a and 28b can be selected without affecting other paths just by switching on or off the proper differential push-pull amplifiers 40 or 60 while during operation the cascode between mixers effectively suppress the interference of the opposite mixer LO (local oscillator) signals. The respective differential push-pull amplifiers 40 or 60 may be switched via the control signal "a" applied to the respective control contacts of the second transistors (c.f. FIG. 3). The input matching in this mode can be tentatively adjusted by programming the adjustable RC impedance matching circuit (not shown) in order to reduce reflections on the input side, especially, in case of an activated (or deactivated) further signal path 28a or 28b, e.g. for processing a further carrier 32a or 32b.

After processing or amplifying the received signal 32a or 32b same may be output via the respective differential amplifier output 44 of the differential amplifier 40, 60. The capacitors 72a and 72b of the differential output 44 of the differential amplifier 40 and 60 prevent any DC current flowing through the mixer arrangement 82 and filter eventually intermodulation products or (flicker) noise falling into the baseband processor 20. It should be noted that the shown connections between the singular elements illustrated by a single line are a differential two-wire connection having a p-conductor and an n-conductor.

Figure 4B:
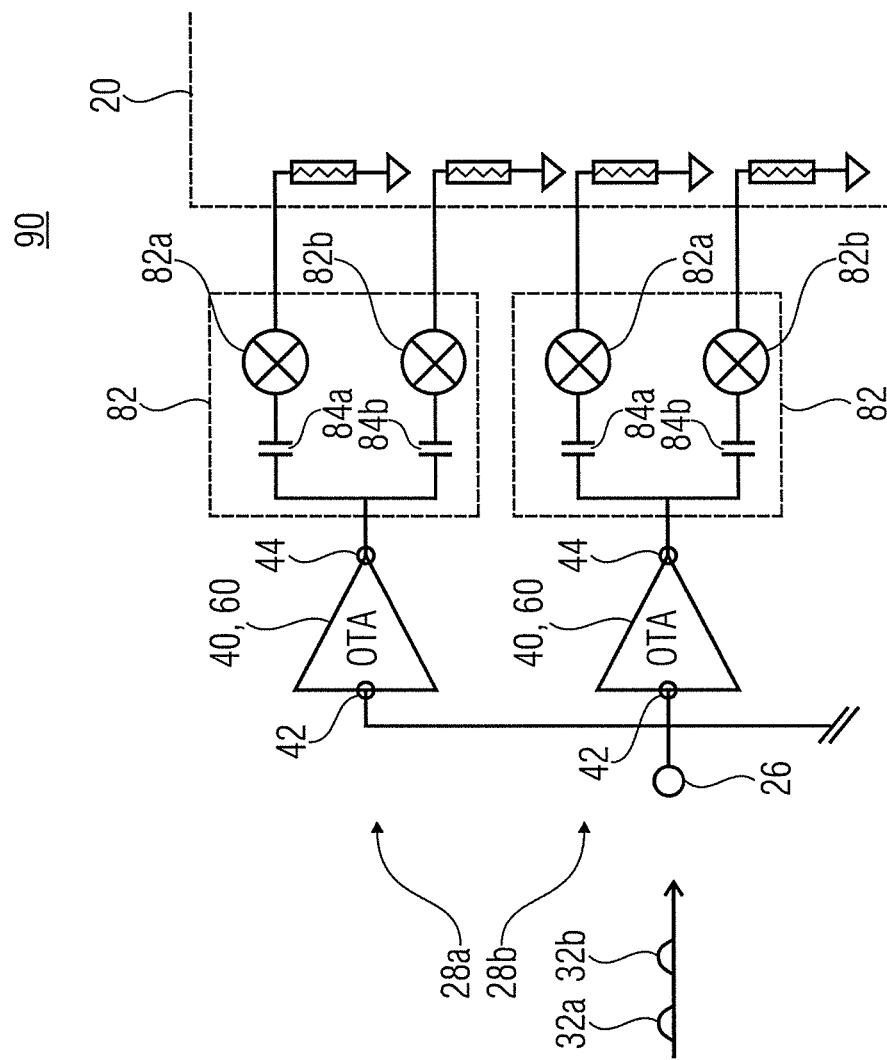

FIG. 4b shows a receiver 90 which is substantially equal to the receiver 80. Here, the output capacitors are integrated into the mixers 82a and 82b of the mixer arranged with 82. So, the mixer 82a comprises capacitors 84a for the p-output and the n-output which are separated from the capacitors 84b of the mixer 82b for p-output and the n-output. Due to this, the two mixers 82a and 82b are not anymore DC-coupled so that a degradation of the signal caused by the auxiliary mixer may be avoided.

Referring to FIGS. 2 and 3, it should be noted that each of the described single-ended differential amplifier 40a and 60a may be used as a single-ended amplifier, so without the second push-pull amplifier 40b and 60b.

Referring to FIG. 3, it should be noted that the two push-pull amplifiers 60a and 60b may comprise more than the show four gain adjusting amplifiers 62a, 64a, 62b and 64b per push-pull amplifier 60a or 60b and, consequently, more than the shown four differential gain canceling transistors 62a', 64a', 62b' and 64b'.

Referring to FIG. 4, it should be noted that the transceiver 80 or 90 may have more than the shown two signal paths 28a and 28b for receiving further carriers in parallel.

The invention claimed is:

1. A push-pull amplifier, comprising:
an amplifier input;
a push amplifier stage comprising a first adjustable impedance matching circuit and two transistors of a first transistor type arranged in series such that an output contact of the first transistor of the first transistor type and an input contact of the second transistor of the first transistor type are coupled to each other via a first common node;
a pull amplifier stage comprising a second adjustable impedance matching circuit and two transistors of a second transistor type arranged in series such that an output contact of the first transistor of the second transistor type and an input contact of the second transistor of the second transistor type are coupled to each other via a second common node; and
an inverting amplifier output;
wherein the respective first transistors of the push amplifier stage and of the pull amplifier stage have control contacts thereof coupled to the amplifier input, wherein the respective adjustable impedance matching circuits have a first side thereof coupled to the amplifier input and a second side thereof coupled to the respective common nodes of the push amplifier stage and of the pull amplifier stage, and wherein the second transistors of the push amplifier stage and the second transistor of the pull amplifier stage have output contacts thereof coupled to each other and to the inverting amplifier output.

2. The push-pull amplifier according to claim 1, wherein the respective impedance matching circuits of the push amplifier stage and of the pull amplifier stage comprise an adjustable resistor and a capacitor connected in series, or a resistor and an adjustable capacitor connected in series, or an adjustable resistor and an adjustable capacitor connected in series.

3. The push-pull amplifier according to claim 1, wherein each control contact of the respective first transistors of the push amplifier stage and of the pull amplifier stage are coupled to the amplifier input via a capacitor.

4. The push-pull amplifier according to claim 1, wherein the inverting amplifier output comprises a capacitor in order to form an AC-coupled output.

5. The push-pull amplifier according to claim 1, wherein the input contacts are source contacts of FET or MOSFET transistors, wherein the output contacts are drain contacts of the FET or MOSFET transistors, and wherein the control contacts are gate contacts of the FET or MOSFET transistors.

6. The push-pull amplifier according to claim 1, wherein the first transistor type is complementary to the second transistor type.

7. The push-pull amplifier according to claim 1, wherein the transistors of the first transistor type are PMOS transistors and the transistors of the second transistor type are NMOS transistors.

8. The push-pull amplifier according to claim 1, which comprises a power supply terminal comprising a Vdd terminal connected to an input contact of the first transistor of the push amplifier stage and a GND terminal connected to an input contact of the first transistor of the pull amplifier stage.

9. The push-pull amplifier according to claim 8, wherein the Vdd terminal and the GND terminal are coupled to the respective input contacts of the first transistors of the push amplifier stage and of the pull amplifier stage via resistors.

10. The push-pull amplifier according to claim 1, wherein the respective first transistors of the push amplifier stage and of the pull amplifier stage are connected via respective control contacts thereof to respective control terminals, wherein a bias of the push-pull amplifier is adjustable by applying a voltage between the control terminals.

11. A differential push-pull amplifier, comprising:
a differential input having a p-input and an n-input;
a differential output having an n-output and a p-output; and
a first push-pull amplifier arranged between the p-input and the n-output and a second push-pull amplifier arranged between the n-input and the p-output, wherein each push-pull amplifier comprises:
an amplifier input connected to the p-input or to the n-input;
a push amplifier stage comprising a first adjustable impedance matching circuit and two transistors of a first transistor type arranged in series such that an output contact of the first transistor of the first transistor type and an input contact of the second transistor of the first transistor type are coupled to each other via a first common node;
a pull amplifier stage comprising a second adjustable impedance matching circuit and two transistors of a second transistor type arranged in series such that an output contact of the first transistor of the second transistor type and an input contact of the second transistor of the second transistor type are coupled to each other via a second common node; and
an inverting amplifier output connected to the n-output or to the p-output;
wherein the respective first transistors of the push amplifier stage and of the pull amplifier stage have control contacts thereof coupled to the amplifier input, wherein the respective adjustable impedance matching circuits have a first side thereof coupled to the amplifier input and a second side thereof coupled to the respective common nodes of the push amplifier stage and of the pull amplifier stage, and wherein the second transistor of the push amplifier stage and the second transistor of the pull amplifier stage have an output contact thereof coupled to each other and to the inverting amplifier output.

12. The differential push-pull amplifier according to claim 11, wherein the push amplifier stages of the first and the second push-pull amplifier comprise one or more gain adjusting transistors of the first transistor type arranged in parallel with the respective second transistors of the first transistor type such that the one or more gain adjusting transistors are connected between the respective first common nodes and the respective inverting amplifier outputs,
wherein the pull amplifier stages of the first and the second push-pull amplifier comprises one or more gain adjusting transistors of the second transistor type arranged in parallel with the respective second transistors of the second transistor type such that the one or more gain adjusting transistors are connected between the respective second common nodes and the respective inverting amplifier outputs.

13. The differential push-pull amplifier according to claim 12, wherein each of the one or more gain adjusting transistors of the push amplifier stages comprises a differential gain cancelling transistor of the first transistor type which is connected between the first common node and a non-inverting amplifier output, and wherein each of the one or more gain adjusting transistors of the pull amplifier stages comprises a differential gain cancelling transistor of the second transistor type which is connected between the second common node and the non-inverting amplifier output.

14. The differential push-pull amplifier according to claim 13, wherein the respective second transistors, the respective one or more gain adjusting transistors and the respective differential gain cancelling transistor of the push amplifier stages and of the pull amplifier stages have a control contact thereof via which same are selectively controllable in order to provide a gradual gain adjustment of the amplifier stages.

15. The differential push-pull amplifier according to claim 11, wherein the differential output is coupled to a first mixer configured to output a quadrature component of an input signal and to a second mixer configured to output an in-phase component of an input signal.

16. The differential push-pull amplifier according to claim 15, further comprising a first capacitor, arranged between the first mixer and the n-output, and a second capacitor, arranged between the first mixer and the p-output, a third capacitor, arranged between the second mixer and the n-output, and a fourth capacitor, arranged between the second mixer and the p-output.

17. The differential push-pull amplifier according to claim 11, wherein the inverting amplifier output of the first push-pull amplifier is coupled to the n-output via a first capacitor, wherein the inverting amplifier output of the second push-pull amplifier is coupled to the p-output via a second capacitor.

18. A differential push-pull amplifier, comprising:
a differential input having a p-input and an n-input;
a differential output having an n-output comprising a first capacitor and a p-output comprising a second capacitor; and
a first push-pull amplifier arranged between the p-input and the n-output and a second push-pull amplifier arranged between the n-input and the p-output, wherein each push-pull amplifier comprises:
an amplifier input connected to the p-input or to the n-input;
a push amplifier stage comprising a first impedance matching circuit, comprising a first adjustable resistor and a first capacitor connected in series, and two MOSFET transistors of a PMOS type arranged in series such that an output contact of the first MOSFET transistor of the PMOS type and an input contact of the second MOSFET transistor of the PMOS type are coupled to each other via a first common node;
a pull amplifier stage comprising a second impedance matching circuit, comprising a second adjustable resistor and a second capacitor connected in series, and two MOSFET transistors of a NMOS type arranged in series such that an output contact of the first MOSFET transistor of the NMOS type and an input contact of the second MOSFET transistor of the NMOS type are coupled to each other via a second common node; and
an inverting amplifier output connected to the n-output or to the p-output,
wherein the respective first MOSFET transistors of the push amplifier stage and of the pull amplifier stage have control contacts thereof coupled to the amplifier input, wherein the respective adjustable impedance matching circuits have a first side thereof coupled to the amplifier input and a second side thereof coupled to the respective common nodes of the push amplifier stage and of the pull amplifier stage, and wherein the second MOSFET transistor of the push amplifier stage and the second MOSFET transistor of the pull amplifier stage have an output contact thereof coupled to each other and to the inverting amplifier output, wherein the push amplifier stages of the first and the second push-pull amplifier comprise one or more gain adjusting MOSFET transistors of the PMOS type arranged in parallel to the respective second MOSFET transistors of the PMOS type such that the one or more gain adjusting MOSFET transistors are connected between the respective first common nodes and the respective inverting amplifier outputs, wherein the pull amplifier stages of the first and the second push-pull amplifier comprises one or more gain adjusting MOSFET transistors of the NMOS type arranged in parallel to the respective second MOSFET transistors of the NMOS type such that the one or more gain adjusting MOSFET transistors are connected between the respective second common nodes and the respective inverting amplifier outputs, wherein each of the one or more gain adjusting MOSFET transistors of the push amplifier stages comprises a differential gain cancelling MOSFET transistor of the PMOS type which is connected between the respective first common nodes and a respective non-inverting amplifier output, wherein each of the one or more gain adjusting MOSFET transistors of the pull amplifier stages comprises a differential gain cancelling MOSFET transistor of the NMOS type which is connected between the respective second common nodes and the respective non-inverting amplifier outputs, wherein the non-inverting amplifier output of the first push-pull amplifier is connected to the inverting amplifier output of the second push-pull amplifier and wherein the non-inverting amplifier output of the second push-pull amplifier is connected to the inverting amplifier output of the first push-pull amplifier.

19. A transceiver circuit, comprising:
a first differential push-pull amplifier comprising:
a differential input having a p-input and to an n-input;
a differential output having an n-output and p-output and being coupled to a first mixer configured to output a quadrature component of an input signal and to a second mixer configured to output an in-phase component of an input signal;
a first push-pull amplifier arranged between the p-input and the n-output and a second push-pull amplifier arranged between the n-input and the p-output, wherein each push-pull amplifier comprises:
an amplifier input connected to the p-input or to the n-input;
a push amplifier stage comprising a first adjustable impedance matching circuit, two transistors of a first transistor type, which are arranged in series such that an output contact of the first transistor of the first transistor type and an input contact of the second transistor of the first transistor type are coupled to each other via a first common node, and one or more gain adjusting transistors of the first transistor type, which are arranged in parallel to the second transistor of the first transistor type such that the one or more gain adjusting transistors of the first transistor type are connected between the first common node and the inverting amplifier output, wherein each of the one or more gain adjusting transistors of the first transistor type comprises a differential gain cancelling transistor of the first transistor type which is connected between the first common node and a non-inverting amplifier output, a pull amplifier stage comprising a second adjustable impedance matching circuit, two transistors of a second transistor type, which are arranged in series such that an output contact of the first transistor of the second transistor type and an input contact of the second transistor of the second transistor type are coupled to each other via a second common node, and one or more gain adjusting transistors of the second transistor type, which are arranged in parallel to the second transistor of the second transistor type such that the one or more gain adjusting transistors of the second transistor type are connected between the second common node and the inverting amplifier output, wherein each of the one or more gain adjusting transistors of the second transistor type comprises a differential gain cancelling transistor of the second transistor type which is connected between the second common node and the non-inverting amplifier output, wherein the inverting amplifier output is connected to the n-output or to the p-output, wherein the respective first transistors of the push amplifier stage and of the pull amplifier stage have control contacts thereof coupled to the amplifier input, wherein the respective adjustable impedance matching circuits have a first side thereof coupled to the amplifier input and a second side thereof coupled to the respective common nodes of the push amplifier stage and of the pull amplifier stage, and wherein the second transistors of the push amplifier stage and the second transistor of the pull amplifier stage have output contacts thereof coupled to each other and to the inverting amplifier output, wherein the non-inverting amplifier output of the first push-pull amplifier is connected to the inverting amplifier output of the second push-pull amplifier and wherein the non-inverting amplifier output of the second push-pull amplifier is connected to the inverting amplifier output of the first push-pull amplifier.

20. The transceiver circuit according to claim 19, comprising a second differential push-pull amplifier, wherein the differential input of the first differential push-pull amplifier is connected to the differential input of the second differential push-pull amplifier.

21. The transceiver circuit according to claim 20, wherein the differential inputs of the first and second differential push-pull amplifiers are coupled to an antenna of a mobile communication device.

22. The transceiver circuit according to claim 19, wherein the respective n-outputs of the first and the second differential push-pull amplifier comprise first capacitors and the respective p-outputs comprise second capacitors, which are arranged such that the respective first and second mixers are AC-coupled.

23. A mobile communication device, comprising:
a transceiver circuit which comprises at least one differential push-pull amplifier comprising:
a differential input having a p-input and an n-input;
a differential output having an n-output and p-output and being coupled to a first mixer configured to output a quadrature component of an input signal and to a second mixer configured to output an in-phase component of an input signal;
a first push-pull amplifier arranged between the p-input and the n-output and a second push-pull amplifier arranged between the n-input and the p-output, wherein each push-pull amplifier comprises:

an amplifier input connected to the p-input or to the n-input;

a push amplifier stage comprising a first adjustable impedance matching circuit, two transistors of a first transistor type, which are arranged in series such that an output contact of the first transistor of the first transistor type and an input contact of the second transistor of the first transistor type are coupled to each other via a first common node, and one or more gain adjusting transistors of the first transistor type, which are arranged in parallel to the second transistor of the first transistor type such that the one or more gain adjusting transistors of the first transistor type are connected between the first common node and an inverting amplifier output, wherein each of the one or more gain adjusting transistors of the first transistor type comprises a differential gain cancelling transistor of the first transistor type which is connected between the first common node and an non-inverting amplifier output, a pull amplifier stage comprising a second adjustable impedance matching circuit and two transistors of a second transistor type, which are arranged in series such that an output contact of the first transistor of the second transistor type and an input contact of the second transistor of the second transistor type are coupled to each other via a second common node, and one or more gain adjusting transistors of the second transistor type, which are arranged in parallel to the second transistor of the second transistor type such that the one or more gain adjusting transistors of the second transistor type are connected between the second common node and the inverting amplifier output, wherein each of the one or more gain adjusting transistors of the second transistor type comprises a differential gain cancelling transistor of the second transistor type which is connected between the second common node and the non-inverting amplifier output, wherein the inverting amplifier output is connected to the n-output or to the p-output, wherein the respective first transistors of the push amplifier stages and of the pull amplifier stages have control contacts thereof coupled to the amplifier input, wherein the respective adjustable impedance matching circuits have a first side thereof coupled to the amplifier input and a second side thereof coupled to the respective common nodes of the push amplifier stages and of the pull amplifier stages, and wherein the second transistors of the push amplifier stages and the second transistors of the pull amplifier stages have output contacts thereof coupled to each other and to the respective inverting amplifier output of the first and second push-pull amplifiers, wherein the non-inverting amplifier output of the first push-pull amplifier is connected to the inverting amplifier output of the second push-pull amplifier and wherein the non-inverting amplifier output of the second push-pull amplifier is connected to the inverting amplifier output of the first push-pull amplifier.

24. The push-pull amplifier of claim 1, wherein the first adjustable impedance matching circuit comprises a first adjustable RC impedance matching circuit, and wherein the second adjustable impedance matching circuit comprises a second adjustable RC impedance matching circuit.

25. The differential push-pull amplifier of claim 11, wherein the first adjustable impedance matching circuit comprises a first adjustable RC impedance matching circuit, and wherein the second adjustable impedance matching circuit comprises a second adjustable RC impedance matching circuit.

26. The differential push-pull amplifier of claim 18, wherein the first impedance matching circuit comprises a first RC impedance matching circuit, and wherein the second impedance matching circuit comprises a second RC impedance matching circuit.

27. The transceiver circuit of claim 19, wherein the first adjustable impedance matching circuit comprises a first adjustable RC impedance matching circuit, and wherein the second adjustable impedance matching circuit comprises a second adjustable RC impedance matching circuit.

28. The mobile communication device of claim 23, wherein the first adjustable impedance matching circuit comprises a first adjustable RC impedance matching circuit, and wherein the second adjustable impedance matching circuit comprises a second adjustable RC impedance matching circuit.

* * * * *